United States Patent
Hamada (10) Patent No.: US 7,984,350 B2
(45) Date of Patent: Jul. 19, 2011

(54) LOGIC CIRCUITRY AND RECORDING MEDIUM

(75) Inventor: Shuji Hamada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 450 days.

(21) Appl. No.: 12/035,884

(22) Filed: Feb. 22, 2008

(65) Prior Publication Data

US 2008/0209286 A1 Aug. 28, 2008

(30) Foreign Application Priority Data

Feb. 22, 2007 (JP) ................................. 2007-042206

(51) Int. Cl.
*G01R 31/28* (2006.01)

(52) U.S. Cl. ............ 714/731; 714/30; 714/37; 714/709; 714/745; 714/726; 714/724; 714/700; 714/738; 324/158.1; 324/765

(58) Field of Classification Search ........................ None
See application file for complete search history.

(56) References Cited

U.S. PATENT DOCUMENTS

| | | | |
|---|---|---|---|
| 5,450,414 A * | 9/1995 | Lin | 714/726 |
| 6,038,691 A * | 3/2000 | Nakao et al. | 714/733 |
| 7,546,500 B2 * | 6/2009 | Kapur et al. | 714/726 |
| 2004/0133825 A1* | 7/2004 | Kobayashi | 714/700 |
| 2004/0177299 A1* | 9/2004 | Wang et al. | 714/726 |
| 2007/0288822 A1* | 12/2007 | Lin et al. | 714/741 |
| 2008/0092093 A1* | 4/2008 | Balakrishnan et al. | 716/4 |

OTHER PUBLICATIONS

"A Novel Delay Fault Testing Methodology Using Low-Overhead Built-in Delay Sensor", Ghosh et al., IEEE Transactions on Computer Design, vol. 25 No. 12, Dec. 2006.*
"Delay Fault Localization in Test-Per-Scan BIST Using Built-In Delay Sensor", Ghosh et al., IEEE International On-Line Testing Symposium, 0-7695-2620-9/06.*
Paul H. Bardell, William. McAnney, Jacob Savir; *"Built-In Test for VLSI: Pseudorandom Techniques"*; Oct. 1987; pp. 23-24, Wiley-Interscience; USA.

* cited by examiner

*Primary Examiner* — John P Trimmings
(74) *Attorney, Agent, or Firm* — Arent Fox LLP (57) ABSTRACT

Logic circuitry has a test point to detect a signal about a delay fault propagating on a logic path between an input terminal and an output terminal, the test point being coupled to the logic path, wherein the test point includes a delay component to delay timing to detect the signal about a delay fault propagating on the logic path by predetermined time.

7 Claims, 6 Drawing Sheets

LOGIC CIRCUITRY AND RECORDING MEDIUM

CROSS-REFERENCE TO RELATED APPLICATION

This application is based upon and claims the benefit of priority from the prior Japanese Patent Application No. 2007-042206 filed on Feb. 22, 2007, the entire contents of which are incorporated herein by reference.

BACKGROUND OF THE INVENTION

1. Field of the Invention

The present invention relates to logic circuitry including a test point to detect a delay fault propagating on a logic path between input and output terminals, the test point being connected to the logic path, and also relates to a recording medium containing design data about the logic circuitry.

2. Description of the Related Art

In a process of manufacturing logic circuitry, a quality test is conventionally performed to provide high-quality products. For example, in a semiconductor integrated circuit including a plurality of logic circuits, a delay test to detect a delay fault is performed.

Figure 1:
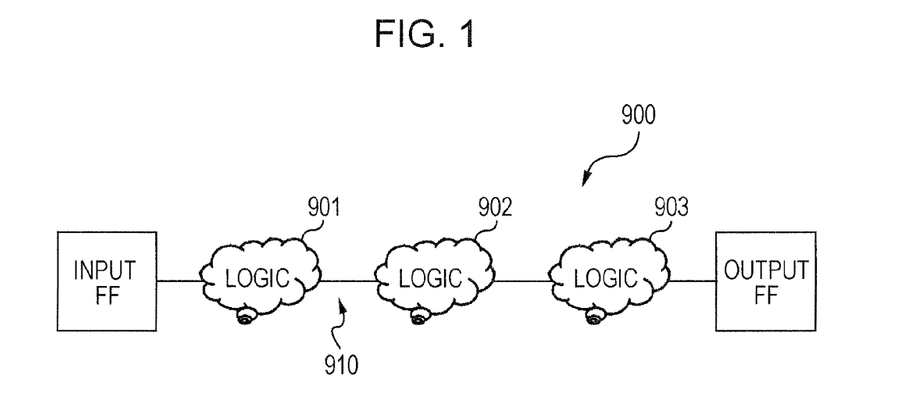
FIG. 1 illustrates an example of a configuration of conventional logic circuitry.
Figure 2:
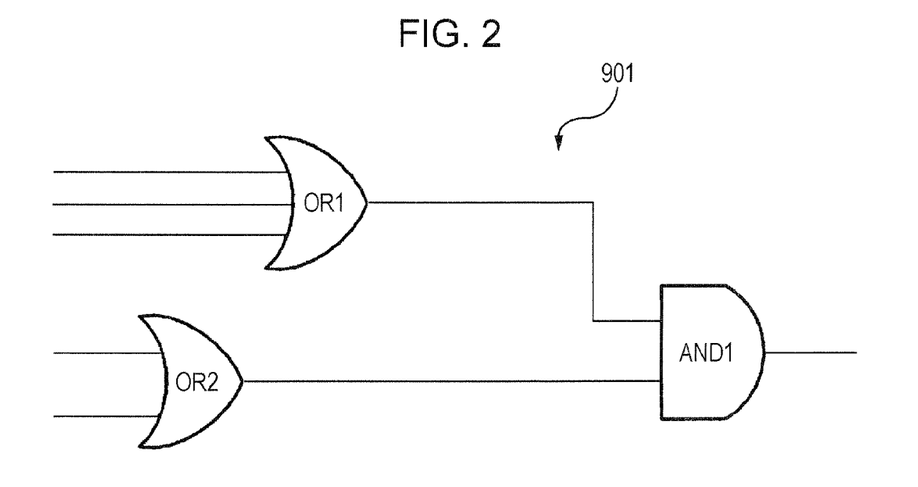
FIG. 2 is a circuit diagram illustrating an example of a configuration of a conventional logic circuit.

FIG. 1 illustrates an example of a configuration of conventional logic circuitry 900. FIG. 2 is a circuit diagram illustrating an example of a configuration of a logic circuit 901 in the logic circuitry 900. The logic circuitry 900 includes a plurality of circuits (logic circuits 901 to 903) having logic gates, which are placed between an input terminal (input FF: flip-flop) and an output terminal (output FF: flip-flip) The logic circuits 901 to 903 are mutually connected via a logic path 910 on which a signal propagates from the input terminal to the output terminal. A signal propagates on the logic path 910 from the input terminal through the logic circuits 901, 902, and 903 to the output terminal. As described above, each of the logic circuits (e.g., the logic circuit 901) in the logic circuitry 900 is constituted by a combination of logic gates, as illustrated in FIG. 2.

As a typical method for performing a delay test in the above-described logic circuitry 900, a method of inputting signals of predetermined patterns can be used. In this method, a delay fault occurred in the logic circuits 901 to 903 is detected by monitoring input of signal transition to the input terminal and output of signal propagation observed at the output terminal after propagation through the logic circuitry 900. At this time, setting of patterns of signals to be input to the input terminal is adjusted in accordance with whether a delay fault occurs in any of the circuits. That is, a test is performed by inputting signals each having a pattern allowing the signal about an occurred delay fault to propagate to the output terminal.

For example, when a delay fault occurs in the logic circuit 901, a signal about the delay fault is output from the logic circuit 901 to the logic path 910 (between the logic circuits 901 and 902). The output signal about the delay fault propagates to the logic circuits 902 and 903 in subsequent stages in order via the logic path 910 (between the logic circuits 901 and 902). The signal about the delay fault means a signal in a fault state that is delayed by predetermined time due to the fault occurred in the logic circuit 901 after being input to the input terminal.

In the delay test, setting is done so that the signal about the delay fault propagates to the output terminal. Specifically, the pattern of the signal to be input to the input terminal is designed so that the signal about the delay fault does not change in the logic circuit 902 when being input to the logic circuit 902 after propagating on the logic path 910 from the logic circuit 901 and that the signal passes through the logic circuit 902 while being kept in an original state. The signal about the delay fault passed through the logic circuit 902 further propagates on the logic path 910 (between the logic circuits 902 and 903) from the logic circuit 902 and is input to the logic circuit 903. In this logic circuit 903, too, the signal about the delay fault should not change and pass therethrough while being kept in the original state. Thus, the signal to be input to the input terminal needs to have a pattern for an effect of both the logic circuits 902 and 903. During execution of the delay test, signals of patterns designed in view of a delay fault that would occur in the respective logic circuits 901 to 903 are sequentially input.

In recent years, a method of connecting a test point to an arbitrary position of the logic path 910 of the logic circuitry 900 has been widely used. The test point is broadly classified into a controllability test point or an observability test point according to its function.

Figure 3:
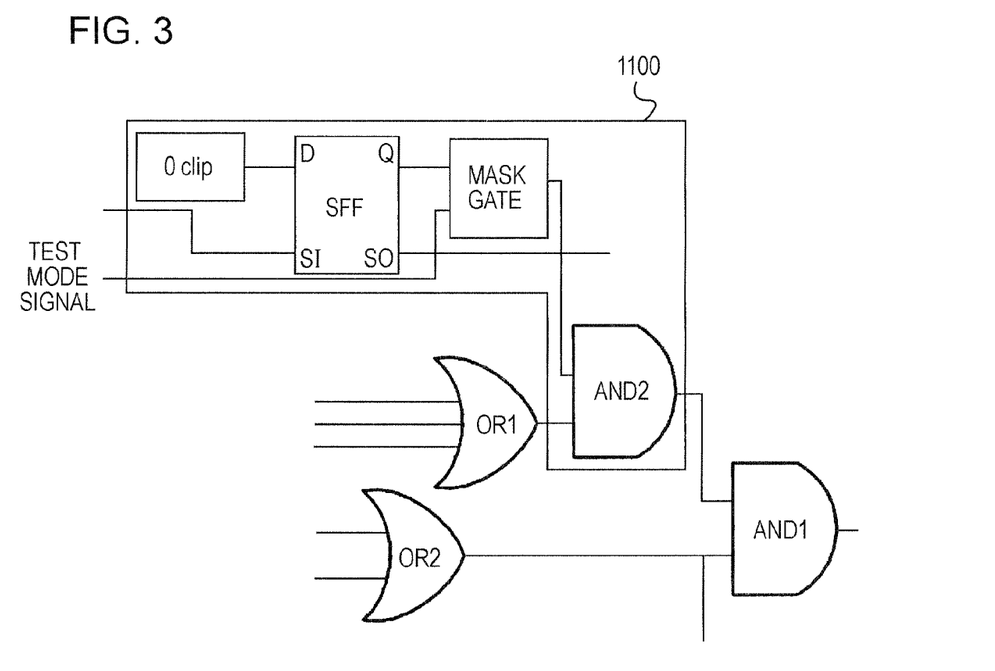
FIG. 3 is a circuit diagram illustrating a conventional controllability test point.

FIG. 3 is a circuit diagram illustrating a configuration in which a controllability test point 1100 connects to the logic circuit 901 illustrated in FIG. 2. The test point 1100 is capable of generating a signal about a delay fault in the logic circuit 901 in a pseudo manner and allowing the generated signal to propagate from the logic circuit 901 to the logic path 910 connected to the logic circuit 902 (see FIG. 1). That is, a delay test of the logic circuits 902 to 903 can be easily performed by controlling the test point 1100.

Figure 4:
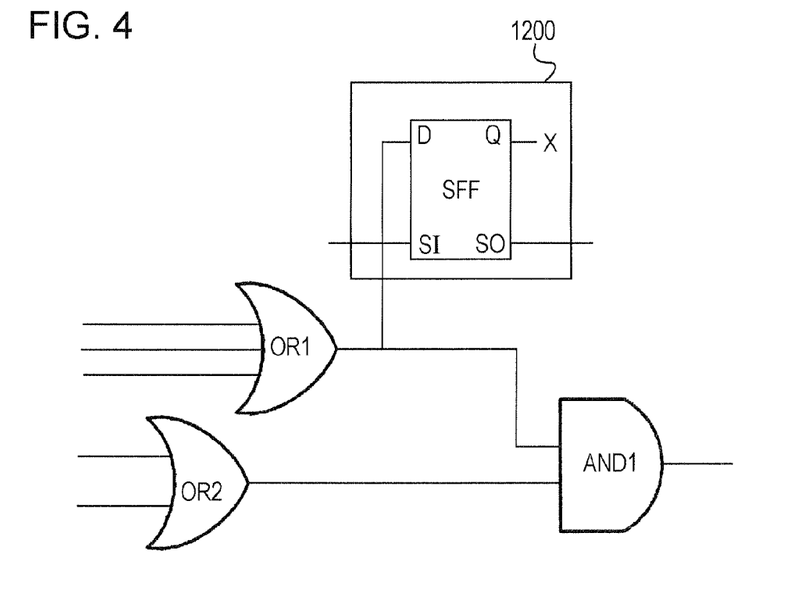
FIG. 4 is a circuit diagram illustrating a conventional observability test point.

FIG. 4 is a circuit diagram illustrating a configuration in which an observability test point 1200 connects to the logic circuit 901 illustrated in FIG. 2. The test point 1200 detects a signal about a delay fault from the logic path 910 between the logic circuits 901 and 902 when the delay fault occurs in the logic circuit 901. If a logic circuit is provided in a previous stage of the logic circuit 901 and if such a pattern that a signal passes through the logic circuit 901 is input, a signal about a delay fault in the logic circuit in the previous stage can be detected.

However, in the above-described method for detecting a signal about a delay fault from the output terminal, the number of patterns of signals to be input to the input terminal at a test becomes enormous, if the configuration of the logic circuitry 900 is complicated and if the number of logic circuits increases. As a result, the amount of information processed at the test increases and the speed of generating the test decreases disadvantageously.

Detection of a delay fault is performed at every system cycle of the logic circuitry to be tested. In that case, if a delay fault occurred in the logic circuitry is slight relative to the system cycle in the method using the test point, as illustrated in FIGS. 3 and 4, it is possible that the test point does not function. For example, a signal about a delay fault detected by an observability test point in an intermediate stage of the logic circuitry 900, e.g., the logic path 910 connecting the logic circuits 901 to 903, is not detected as a delay fault. Also, even if signal transition is generated by a controllability test point, that is not detected as a fault at the output terminal. In this way, a slight delay fault cannot be detected in a delay test, which degrades the quality of the delay test.

SUMMARY OF THE INVENTION

According to one aspect of an embodiment, there is logic circuitry including a test point to detect a signal about a delay fault propagating on a logic path between an input terminal and an output terminal, the test point being coupled to the logic path. The test point includes a delay component to delay timing to detect the signal about a delay fault propagating on the logic path by predetermined time.

According to another aspect of an embodiment, there is logic circuitry including an observability test point to detect a signal about a delay fault propagating in an observed part of a logic path between an input terminal and an output terminal. The test point provides a delay component to delay timing to detect the signal about a delay fault propagating from the logic path by propagation time in a latter part of the logic path from a connection point of the test point in the logic path to the output terminal.

According to another aspect of an embodiment, there is logic circuitry including a test point allowing a signal about a delay fault to propagate on a logic path between an input terminal and an output terminal, the test point being coupled to the logic path so that signal transition occurs in a controlled part of the logic path. The test point provides a delay component to delay timing to propagate the signal about a delay fault by propagation time in a former part of the logic path from the input terminal to a connection point of the test point.

A recording medium according to an embodiment contains design data about the above-described logic circuitry in a computer readable manner.

DESCRIPTION OF THE PREFERRED EMBODIMENTS

Figure 5:
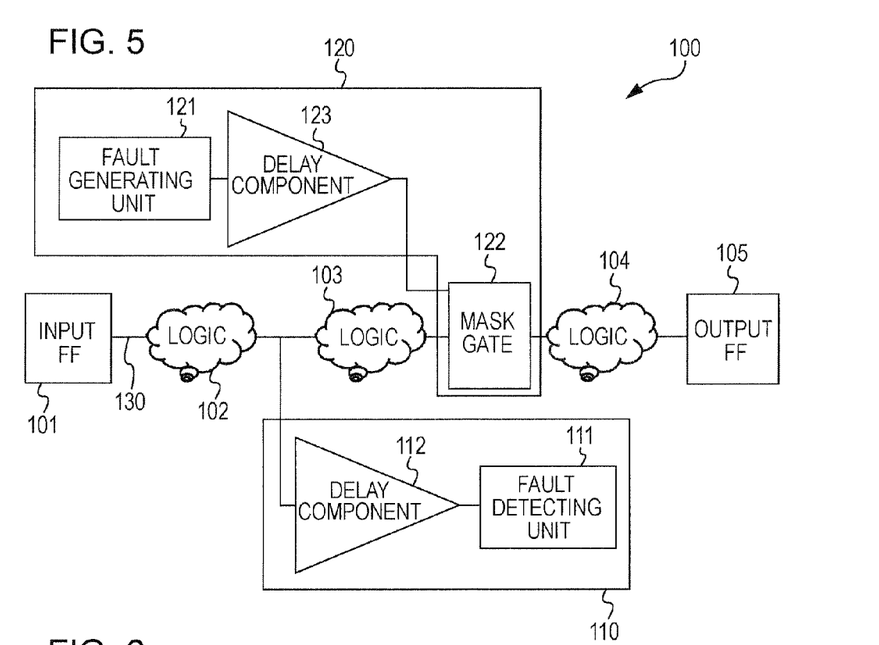
FIG. 5 illustrates an overview of logic circuitry.

An overview of logic circuitry according to an embodiment is described. FIG. 5 illustrates the overview of logic circuitry 100. The logic circuitry 100 includes logic circuits 102, 103, and 104 having logic gates, which are placed between an input terminal (FF: flip-flop) 101 and an output terminal (FF: flip-flop) 105. The logic circuits 102 to 104 are mutually connected via a logic path 130. Also, the logic circuitry 100 includes an observability test point 110 and a controllability test point 120.

During execution of a delay test, a signal pattern for the test is input through the input terminal (FF) 101, and the observability test point 110 and the output terminal (FF) 105 detects a signal about a delay fault. Detection of a delay fault is performed at every system cycle of the logic circuitry 100. In a case where signal transition is generated by the controllability test point 120, if another observability test point (not shown) is connected in a subsequent stage of the controllability test point 120, the signal about the delay fault propagated from the controllability test point 120 is detected by the observability test point. If the observability test point is not connected, the signal about the delay fault is detected by the output terminal (FF) 105.

The observability test point 110 includes a fault detecting unit 111 and a delay component (DC) 112. The fault detecting unit 111 detects a signal about a delay fault propagating on the logic path 130. The DC 112 delays timing when a signal about a delay fault propagating on the logic path 130 reaches the fault detecting unit 111 by predetermined time. That is, in the observability test point 110, timing when the fault detecting unit 111 detects a signal about a delay fault delays by predetermined time relative to timing when the signal about the delay fault actually propagates through a point where the observability test point 110 connects to the logic path 130.

The controllability test point 120 includes a fault generating unit 121, a mask gate 122, and a DC 123. The fault generating unit 121 generates a signal about a delay fault. The mask gate 122 determines whether a signal about a delay fault generated by the fault generating unit 121 should be allowed to propagate on the logic path 130. At this time, whether a signal about a delay fault should be allowed to propagate on the logic path 130, to which the controllability test point 120 connects, is determined based on instructions from the outside, such as a delay test program.

The DC 123 delays timing when a signal about a delay fault generated by the fault generating unit 121 propagates to the logic path 130 by predetermined time. That is, timing when a signal about a delay fault generated by the fault generating unit 121 propagates to the logic path 130 delays by predetermined time relative to timing when the signal propagates from the fault generating unit 121 directly to the logic path 130.

As described above, the logic circuitry 100 includes the observability test point 110 and the controllability test point 120, and the test points 110 and 120 include the DCs 112 and 123, respectively. These DCs 112 and 123 enable the logic circuitry 100 to adjust timing to detect a signal about a delay fault.

Adjustment of timing to detect a signal about a delay fault means adjustment to detect a signal about a slight delay fault in the output terminal (FF) 105 and in the fault detecting unit 111 of the observability test point 110 in accordance with the system cycle of the logic circuitry 100.

Hereinafter, timing to detect a delay fault in cases where the observability test point 110 is used and where the controllability test point 120 is used is described with reference to specific examples. Here, a procedure of making the configuration of the logic circuitry 100 by connecting the observability test point 110 including a DC to ordinary logic circuitry including only logic circuits is described with reference to FIGS. 6 to 8. Also, a procedure of making the configuration of the logic circuitry 100 by connecting the controllability test point 120 including a DC to ordinary logic circuitry including only logic circuits is described with reference to FIGS. 9 to 11.

In FIGS. 6 to 11, one of the observability test point and the controllability test point is included in the logic circuitry. The two types of test points may be independently used. Alternatively, the two types of test points may be included in the logic circuitry and used at the same time.

Figure 6:
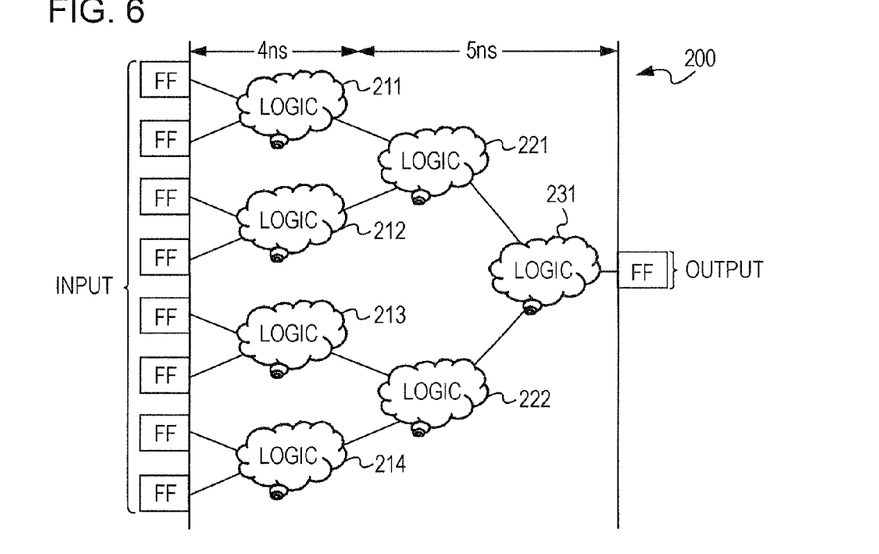
FIG. 6 illustrates an example of logic circuitry of many inputs and fewer outputs.

First, the observability test point is described. FIG. 6 illustrates an example of logic circuitry of many inputs and fewer outputs. The observability test point is used for a test in the logic circuitry of many inputs and fewer outputs illustrated in FIG. 6. In the logic circuitry 200 illustrated in FIG. 6, a logic path is constituted by three stages of logic circuits including logic gates: logic circuits 211 to 214; logic circuits 221 and 222; and a logic circuit 231.

In this case, propagation time from the input terminal to the logic circuits 211 to 214 in the first stage is 4 ns, and propagation time from the logic circuits 221 and 222 in the second stage to the output terminal via the logic circuit 231 in the third stage is 5 ns. The system cycle of the logic circuitry 200 is 10 ns.

Typically, when a delay test of the logic circuitry 200 illustrated in FIG. 6 is performed, cases where a delay fault occurs in each of the logic circuits 211 to 214, 221, 222, and 231 are assumed, and signals of such patterns that signals about delay faults in the respective circuits propagate to the output terminal are generated. Then, a delay test is performed by sequentially inputting the generated signals of all the patterns. Of course, the number of patterns of the signals input to the input terminal is enormous.

Figure 7:
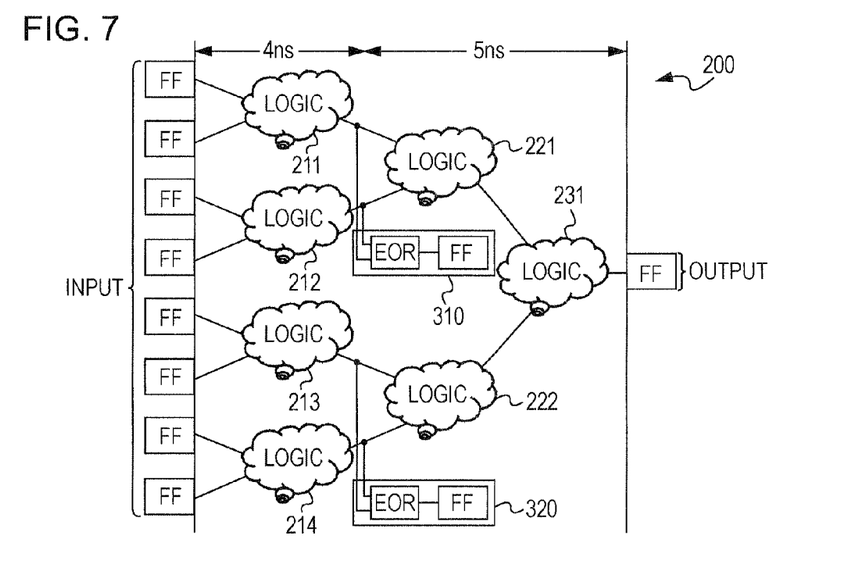
FIG. 7 illustrates an example of connection of observability test points.

Thus, the configuration is changed to reduce the number of patterns of the signals to be input to the input terminal at the delay test of the logic circuitry 200. FIG. 7 illustrates an example of connection of observability test points. In order to reduce the number of patterns of signals to be input to the input terminal, test points 310 and 320 are connected between the logic circuits in the first stage and the logic circuits in the second stage of the logic circuitry 200.

Each of the test points 310 and 320 includes an EOR (exclusive OR) and an FF. The EOR detects a signal about a delay fault and a detected signal is accumulated in the FF. Each of the test points 310 and 320 includes an EOR, which detects a delay fault in one of the two circuits in the first stage. That is, the test point 310 observes the logic circuits 211 and 212, whereas the test pint 320 observes the logic circuits 213 and 214. Two circuits are observed by one test point here, but one circuit may be observed by one test point.

As illustrated in FIG. 7, providing the test points 310 and 320 increases observing points of a delay fault and eliminates the need for propagating a delay fault occurred in the logic circuits 211 to 214 in the first stage to the output terminal. Accordingly, the number of circuits that should be considered to generate patterns allowing a signal about a delay fault to propagate to the output terminal is reduced, so that the number of patterns of signals to be input to the input terminal can be reduced.

However, even in the logic circuitry 200 provided with the test points 310 and 320 illustrated in FIG. 7, a delay fault occurred in the logic circuits 211 to 214 in the first stage is not detected as a delay fault unless the delay fault is a delay of 6 ns or more, because the propagation time from the logic circuits 221 and 222 in the second stage to the output terminal is 5 ns and that the propagation time of the system cycle is 10 ns. In other words, a slight delay fault causing a delay of less than 6 ns is not detected.

Figure 8:
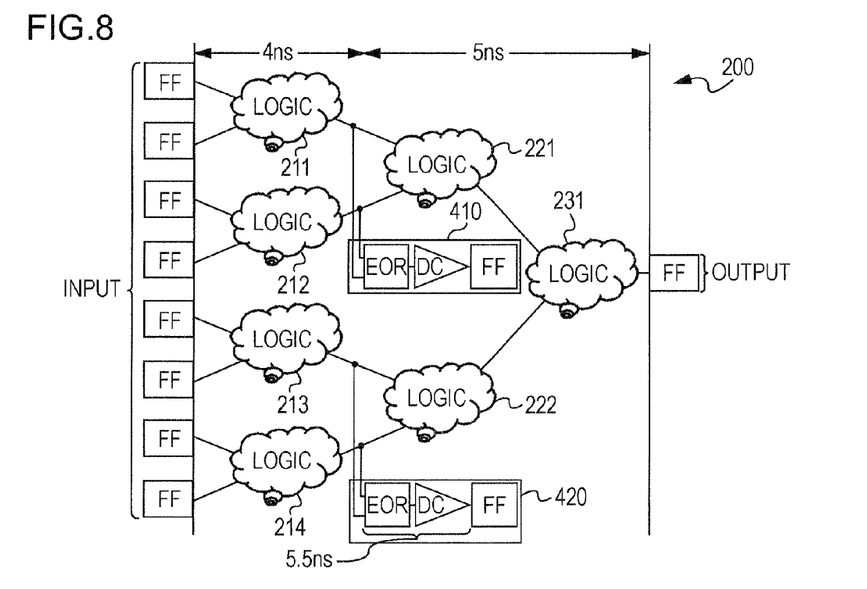
FIG. 8 illustrates observability test points including a delay component.

In order to detect such a slight delay, a DC is provided in each of the test points. FIG. 8 illustrates observability test points including a DC. Each of the test points 410 and 420 in the logic circuitry 200 includes a DC between an EOR and an FF. This DC delays propagation timing by 5.5 ns in view of the system cycle and the propagation time from the circuits in the second stage to the output terminal.

Due to the DC, a signal about a delay fault is accumulated in the FF after the clock cycle of 10 ns has elapsed. Accordingly, the logic circuitry 200 can detect a slight delay fault without depending on the propagation time from the connection points of the test points 410 and 420 to the output terminal.

Figure 9:
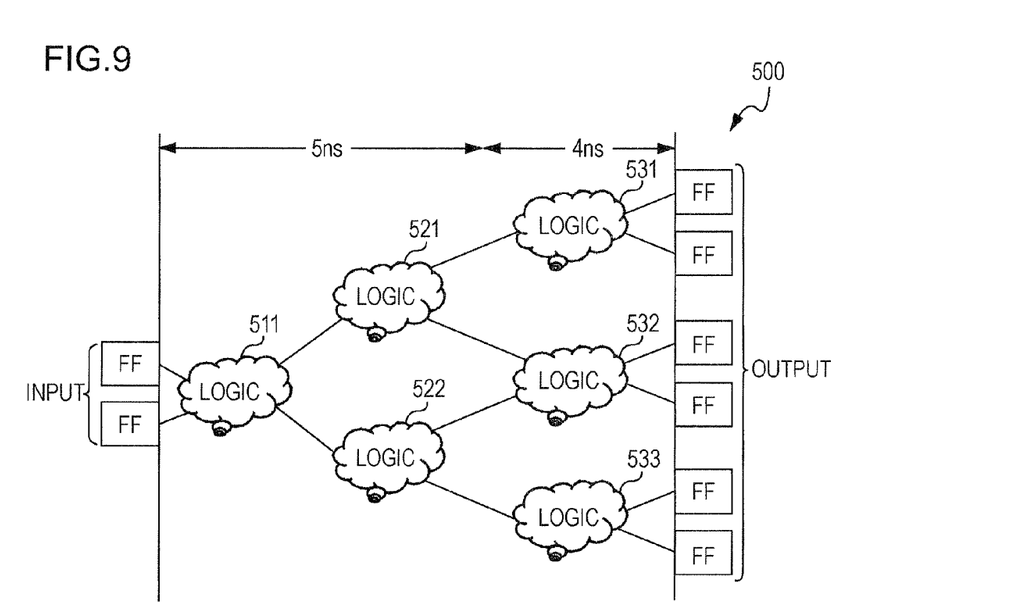
FIG. 9 illustrates an example of logic circuitry of fewer inputs and many outputs.

Next, the controllability test point is described. FIG. 9 illustrates an example of logic circuitry of fewer inputs and many outputs. The controllability test point can be used for a test in the logic circuitry of fewer inputs and many outputs. In the logic circuitry 500 illustrated in FIG. 9, a logic path is constituted by three stages of logic circuits including logic gates: a logic circuit 511; logic circuits 521 and 522; and logic circuits 531 to 533.

In this case, propagation time from the input terminal to the logic circuits 521 and 522 in the second stage is 5 ns, and propagation time from the logic circuits 531 to 533 in the third stage to the output terminal is 4 ns. The system cycle of the logic circuitry 500 is 10 ns.

Typically, when a delay test of the logic circuitry 500 illustrated in FIG. 9 is performed, control in cases where a delay fault occurs in each of the logic circuits 511, 521, 522, and 531 to 533 is assumed, and signals of such patterns that signals about delay faults in the respective circuits propagate to the output terminal are generated. Then, a delay test is performed by sequentially inputting the generated signals of all the patterns. Of course, the number of patterns of the signals input to the input terminal is enormous.

Figure 10:
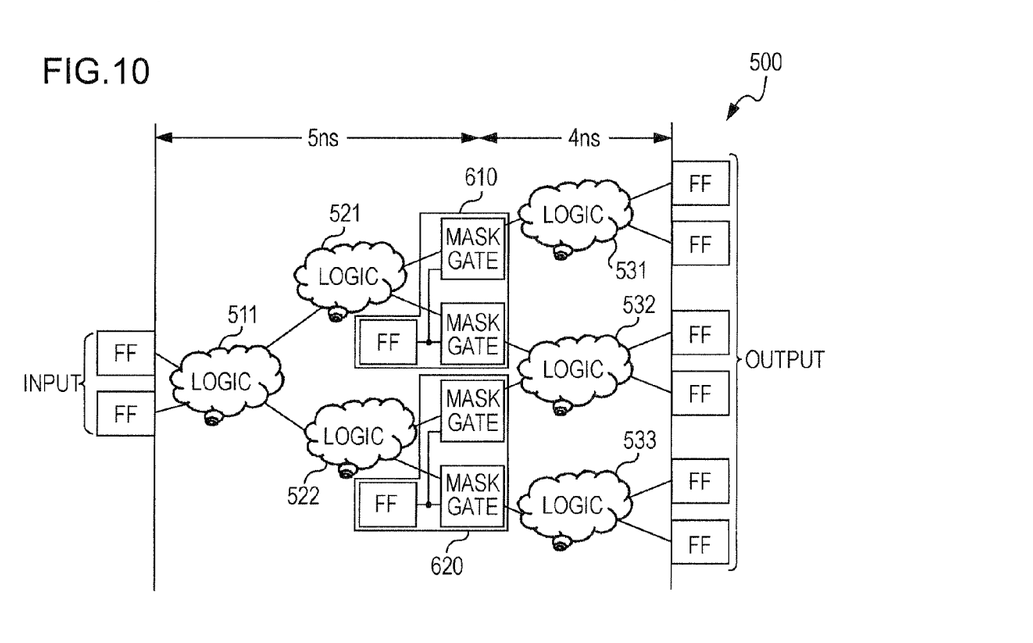
FIG. 10 illustrates an example of connection of controllability test points.

Thus, the configuration is changed to reduce the number of patterns of the signals to be input to the input terminal at the delay test of the logic circuitry 500. FIG. 10 illustrates an example of connection of controllability test points. In order to reduce the number of patterns of signals to be input to the input terminal, test points 610 and 620 capable of controlling a fault are connected between the logic circuits 521 and 522 in the second stage and the logic circuits 531 to 533 in the third stage of the logic circuitry 500.

Each of the test points 610 and 620 includes an FF and mask gates. The FF generates a pseudo delay fault, and the mask gates propagate a signal about the delay fault to a specified logic circuit. Each of the test points 610 and 620 propagates a signal about a delay fault to two circuits in the third stage so as to perform fault control. Alternatively, one test point may be connected to one circuit so as to perform fault control.

As illustrated in FIG. 10, by providing the test points 610 and 620, a delay test can be performed such that an observing point of a delay fault causes a delay fault in the logic circuits 531 to 533 in the third stage. However, even in the logic circuitry 500 provided with the test points 610 and 620, a delay fault is not detected as a delay fault in the output terminal unless the delay fault is a delay of 6 ns or more in view of the propagation time from the test points 610 and 620 to the output terminal. In other words, a delay test of detecting a delay of less than 6 ns cannot be performed.

Figure 11:
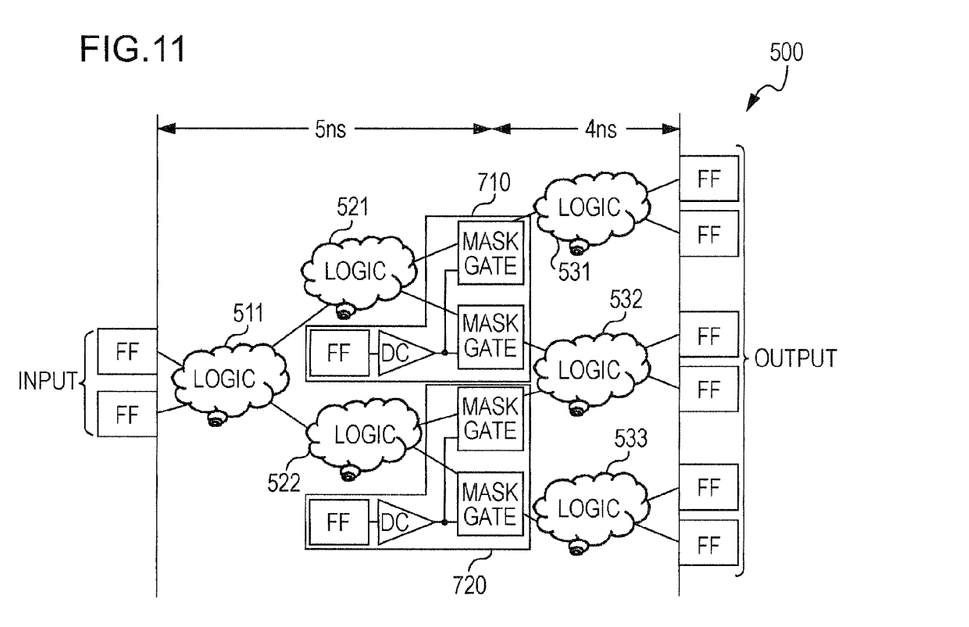
FIG. 11 illustrates controllability test points including a delay component.

In order to detect a slight delay as a delay fault, a DC is provided in each of the test points. FIG. 11 illustrates controllability test points including a DC. Each of the test points 710 and 720 in the logic circuitry 500 includes a DC between an FF and mask gates. This DC delays propagation timing by 5 ns in view of the system cycle and the propagation time from the input terminal to the previous stage of the logic circuits in the third stage.

Due to the DC, a signal about a delay fault is observed in the output terminal after the clock cycle of 10 ns has elapsed. Accordingly, the logic circuitry 500 can use a slight delay fault in a delay test without depending on the propagation time from the input terminal to the connection points of the test points 710 and 720 of the logic path.

Next, setting of delay time in view of a path length and a system cycle is described. In order to perform setting of delay time in view of a path length and a system cycle, a test point capable of selecting an optimal DC from among a plurality of DCs of different delay time may be connected.

Figure 12:
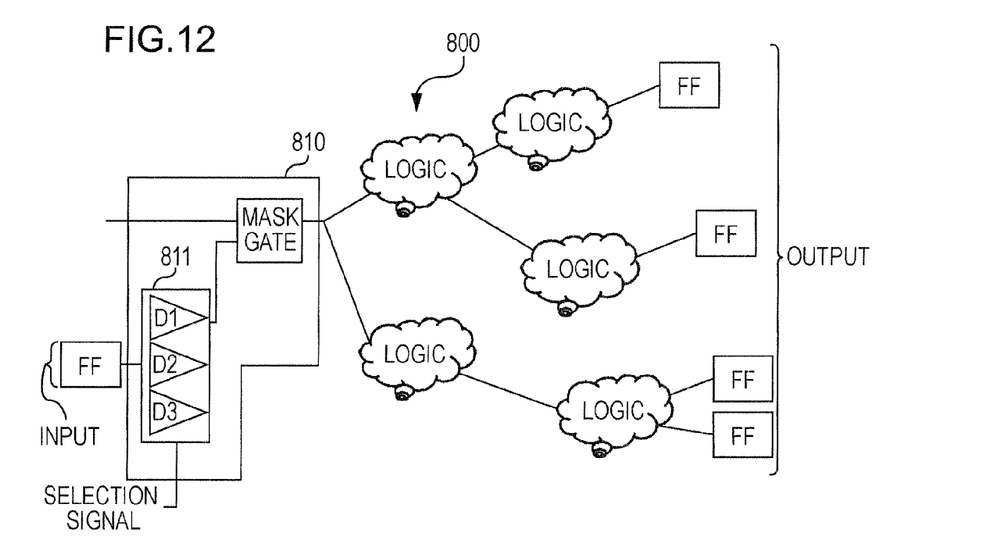
FIG. 12 illustrates an example of a configuration of a test point capable of selecting a delay component.

FIG. 12 illustrates an example of a configuration of a test point capable of selecting a DC. Logic circuitry 800 includes a test point 810 having a selector function. The test point 810 includes a delay unit 811 including a plurality of DCs D1 to D3. By controlling the delay unit 811 by using a selection signal, only one of the DCs D1 to D3 causing an optimal delay in accordance with change in path length or clock cycle of the logic circuitry 800 can be used.

Also, a recording medium containing design data about the logic circuitry 100 described in this embodiment may be prepared. The design data about the logic circuitry 100 is computer-readable electronic data about the logic circuitry 100 represented by RTL (Register Transfer Level) description described in HDL (Hardware Description Language) or a net list after logic synthesis. By expanding such design data in a computer apparatus to which a test tool is installed, a delay test can be performed during a manufacturing process.

By downloading the design data to a PLD (Programmable Logic Device) after processing the design data so that it can be written in the PLD, such as an FPGA (Field Programmable Gate Array), the above-described logic circuitry 100 can be manufactured.

As described above, according to the logic circuitry and the recording medium, a high-quality delay test can be performed.

The logic circuitry and the recording medium are useful to circuits in general including logic gates, and are particularly suitable for an LSI (large-scale integration) of high integration and a system board.

What is claimed is:

1. Logic circuitry, comprising:
   an input terminal;
   an output terminal; and
   a test point for detecting a delay fault signal propagating on a logic path between the input terminal and the output terminal, the test point being coupled to the logic path,
   wherein the test point includes:
      a delay component for delaying a time to detect the signal about the delay fault propagating on the logic path by a specific time;
      a plurality of delay components having different delay values, the delay components being provided in a latter part of the logic path branching from the logic path; and
      a selector for selecting one of the delay components performing a delay operation.

2. Logic circuitry, comprising:
   an input terminal;
   an output terminal; and
   an observability test point to detect a signal about a delay fault propagating in an observed part of a logic path between the input terminal and the output terminal,
   wherein the test point includes:
      a delay component for delaying a time to detect the signal about the delay fault propagating from the logic path by a propagation time in a latter part of the logic path from a connection point of the test point in the logic path to the output terminal;
      a plurality of delay components having different delay values, the delay components being provided in a latter part of the logic path branching from the logic path; and
      a selector for selecting one of the delay components performing a delay operation.

3. Logic circuitry, comprising:
   an input terminal;
   an output terminal; and
   a test point allowing a signal about a delay fault to propagate on a logic path between the input terminal and the output terminal, the test point being coupled to the logic path so that signal transition occurs in a controlled part of the logic path,
   wherein the test point includes:
      a delay component for delaying a time to propagate the signal about the delay fault by a propagation time in a former part of the logic path from the input terminal to a connection point of the test point;
      a plurality of delay components having different delay values, the delay components being provided in a latter part of the logic path branching from the logic path; and
      a selector for selecting one of the delay components performing a delay operation.

4. The logic circuitry according to claim 1, wherein the test point couples to a part of the logic path branching from a latter part of the logic path and the delay component is placed on the branched part.

5. The logic circuitry according to claim 1, wherein the delay component changes the delay time in accordance with instructions from the outside.

6. The logic circuitry according to claim 1,
   wherein the selector accepts selection instructions of the delay component to perform a delay operation according to a system cycle changed if the system cycle of the logic circuitry has changed, and selects the delay component to perform the delay operation in accordance with the selection instructions.

7. The logic circuitry according to claim 1,
   wherein the selector accepts selection instructions of the delay component according to a system cycle and an activated path length of the logic circuitry and selects the delay component to perform the delay operation in accordance with the selection instructions.

* * * * *